United States Patent [19]

O'Loughlin et al.

[11] Patent Number: 5,028,968
[45] Date of Patent: Jul. 2, 1991

[54] RADIATION HARD GAAS HIGH ELECTRON MOBILITY TRANSISTOR

[75] Inventors: Michael J. O'Loughlin, Irvine; Richard J. Krantz, Torrance; Walter L. Bloss, III, Rancho Palos Verdes, all of Calif.

[73] Assignee: The Aerospace Corporation, El Segundo, Calif.

[21] Appl. No.: 460,206

[22] Filed: Jan. 2, 1990

[51] Int. Cl.$^5$ .......................................... H01L 29/161
[52] U.S. Cl. ..................................... 357/16; 357/22; 357/58
[58] Field of Search ................. 357/22 A, 22 MD, 22, 357/16, 58

[56] References Cited

U.S. PATENT DOCUMENTS 4,908,325  3/1990  Berenz ............................ 357/22 A

FOREIGN PATENT DOCUMENTS 61-99378   5/1986  Japan ......................... 357/22 MD
61-176161  8/1986  Japan ......................... 357/22 MD
63-86575   4/1988  Japan ......................... 357/22 A
1-94674    4/1989  Japan ......................... 357/22 A Primary Examiner—Andrew J. James
Assistant Examiner—Courtney A. Bowers
Attorney, Agent, or Firm—William J. Burke

[57] ABSTRACT

The incorporation of a GaAs layer that is intentionally p-doped into a standard HEMT device structure has been shown to produce a HEMT transistor with greatly enhanced radiation hardness under exposure to neutron radiation.

4 Claims, 1 Drawing Sheet

RADIATION HARD GAAS HIGH ELECTRON MOBILITY TRANSISTOR

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

This invention relates to gallium arsenide (GaAs) high electron mobility transistors (HEMTs), in particular, techniques to increase the resistance of HEMTs with respect to neutron radiation.

2. Description of the Prior Art

GaAs HEMTs constitute an increasingly important class of semiconductor. A standard HEMT (also called a MODFET Modulation-Doped Field Effect Transistors) offers speed and power advantages over GaAs MESFET, particularly at cryogenic temperatures.

A typical HEMT device is shown in FIG. 1. A GaAs buffer layer 2 is grown by molecular beam epitaxy (MBE) on the semi-insulating GaAs substrate 4. This is followed by 550 Å of $Al_{0.25}Ga_{0.75}As$, the first 30 Å being an undoped spacer layer 8 and the next 520 Å layer 10 doped with Si at a concentration of $1 \times 10^{18}$ $cm^{-3}$. Next, a highly doped 300 Å GaAs layer 12 is grown on top of the $Al_{0.25}Ga_{0.75}As$ layer 10 to facilitate making ohmic contacts with the source, drain and gate. The concentration of Si in the second doped layer is about $2 \times 10^{18}$ $cm^{-3}$. The contacts for source 14 and drain 16 are standard alloyed AuGe/Ni/Au and the contact for gate 18 is Ti/Pd/Au.

However, the use of HEMTs in space systems has been limited by the susceptibility of HEMTs to neutron radiation. In particular, HEMTs with AlGaAs/GaAs heterojunctions are susceptible to threshold voltage changes induced by neutron radiation.

A SUMMARY OF THE INVENTION

The addition of an intentionally doped p-type GaAs region in the structure of a standard HEMT device produces a HEMT device that has significantly greater hardness to threshold voltage changes induced by neutron radiation.

DETAILED DESCRIPTION OF THE PREFERRED EMBODIMENT

Figure 1:
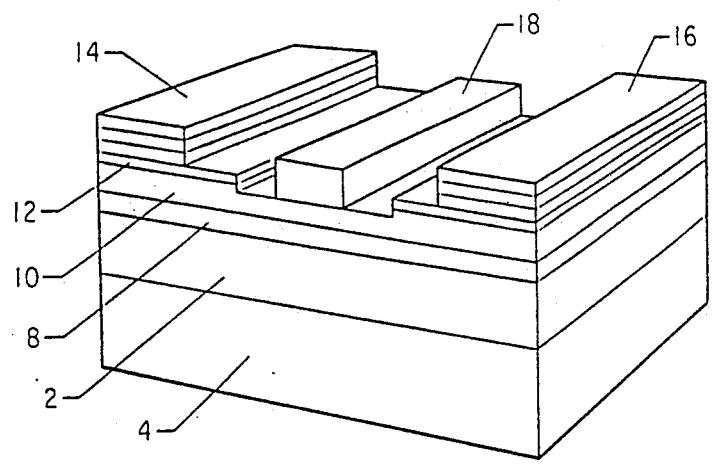
FIG. 1 is a schematic showing the structure of a standard HEMT device.

Extensive experimental and theoretical analyses has shown that the change of the threshold voltage in a standard HEMT as shown in FIG. 1 is due primarily to a redistribution of charge in the undoped GaAs layer rather than degradation in the AlGaAs. R. J. Krantz, W. L. Bloss, M. J. O'Loughlin "High Energy Newton Irratiation Effects in Modulation Doped Field Transistors (MODFETS): Threshold Voltage" IEEE Trans. Nucl. Sci. 35 pp. 1438-1443 (1988). From this result, we concluded that the doping of the GaAs in the depletion layer is an important factor in determining neutron hardness. Assuming other factors are constant, higher doping in the GaAs increases the neutron hardening of these structures.

A model was developed that predicts the variation of the threshold voltage with neutron fluence. This model includes the effects on the threshold voltage of Fermi level shifts, depletion width, trapped charge, 2-D well charge, and carrier removal in the AlGaAs. From the model, we predicted that the threshold shift as a result of neutron damage should decrease if the GaAs region below the AlGaAs interface is doped p-type.

Figure 2:
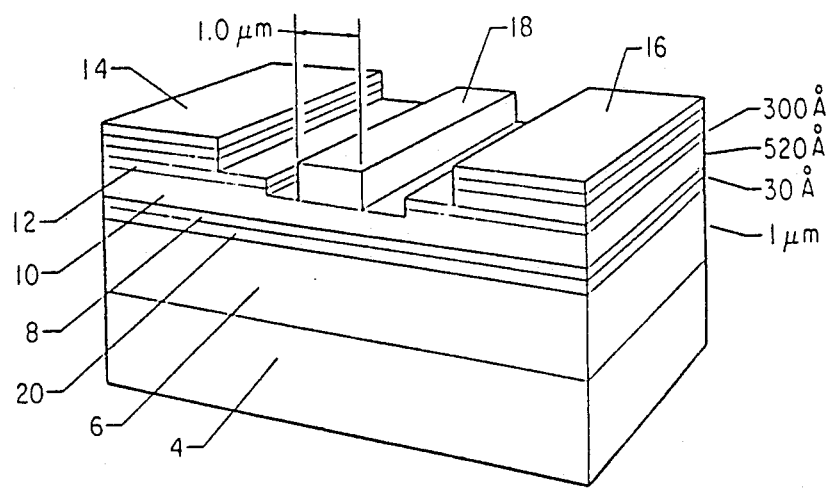
FIG. 2 is a schematic showing the structure of a radiation hardened p-channel HEMT according to the present invention.

A new device structure that makes GaAs high electron mobility transistors (HEMTs) radiation hard with respect to exposure to neutron radiation in accordance with our model is shown in FIG. 2.

The critical distinction between the standard HEMT device shown in FIG. 1 and the present invention shown in FIG. 2 is the substitution in FIG. 2 of an intentionally doped p-type GaAs layer 6 below the AlGaAs/GaAs interface for the unintentionally doped GaAs layer 2 normally employed. This intentionally doped p-type GaAs layer is the key to producing an improved radiation hard HEMT. The model predicts that larger p-type doping will result in a decreasing threshold shift with increasing neutron fluence. However, in order not to decrease the mobility enhancement of the two dimensional electron gas, the p-type region in the GaAs should only be doped to approximately 200 Å below the undoped AlGaAs layer 8. This is accomplished during the MBE growth process in which the GaAs buffer region is doped p-type to about $1 \times 10^{16}$ $cm^{-3}$, followed by 200 Å of unintentionally doped GaAs which forms the conductivity channel 20. This places the p-type acceptors at a far enough distance from the 2-D electron channel at the interface between the AlGaAs layer 8 and the GaAs layer 6 to substantially reduce impurity scattering and maintain the high electron mobility inherent in a modulation doped structure.

Figure 3:
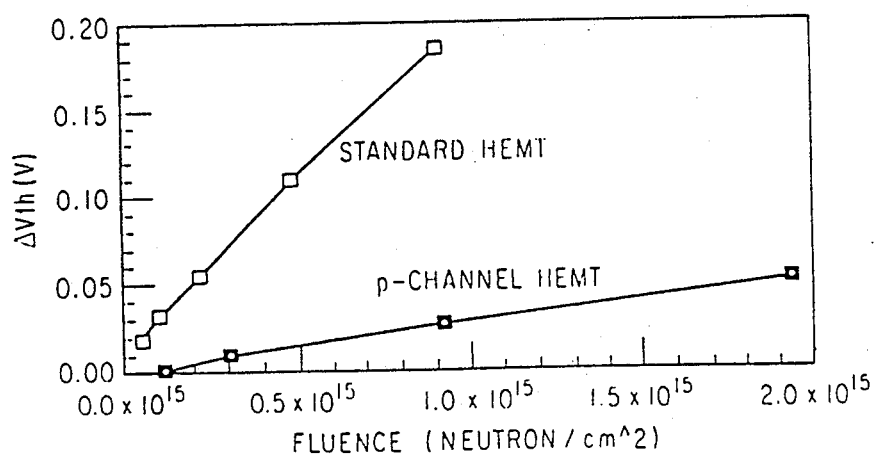
FIG. 3 measures the shift in threshold voltage for the standard HEMT device and for the radiation hardened HEMT device.

In one embodiment, a molecular beam epitaxially grown HEMT wafer with an intentionally doped (Be: $p = 1 \times 10^{16}$ $cm^{-3}$) buffer layer was grown and processed into a multitude of $1.25 \times 20$ $\mu m$ FETs. Each HEMT was characterized by DC parametric analysis both before and after neutron irradiation at neutron fluences (1 MeV Si equivalent) ranging from $1 \times 10^{14}$ to $2 \times 10^{15}$ neutrons/$cm^2$. The threshold voltage, transconductance, saturation current, and mobility were monitored for changes induced by the incident neutrons. These structures were compared to the standard HEMT devices shown in FIG. 1 which did not possess an intentionally doped p-region, although a small unintentionally doped p background concentration always exists as a by-product of the MBE growth process. FIG. 3 shows the change in the measured threshold voltage for the standard HEMT device versus the p-doped device of the present invention as a function of neutron fluence. The change in threshold voltage versus neutron fluence for the p-doped structure is greatly reduced compared to the standard HEMT. For example, at a neutron fluence of $1 \times 10^{15}$ $n/cm^2$, the p-doped HEMT has a radiation hardness of about six times greater than that of the standard HEMT.

It will be obvious to the skilled practitioner that numerous variations can be made to the preferred embodiments described herein without departing from the scope of the invention as defined in the following claims.

We claim:

1. A neutron radiation hardened gallium arsenide and aluminum gallium arsenide high electron mobility transistor (HEMT), comprising
   a) a semi-insulating gallium arsenide substrate;
   b) a doped buffer layer of GaAs, doped with an acceptor impurity supported by the substrate;
   c) an undoped layer about 200 angstroms thick of GaAs supported by the doped buffer layer;
   d) an undoped spacer layer of $Al_{0.25}Ga_{0.75}As$ supported by the undoped layer;
   e) a first doped layer of $Al_{0.25}Ga_{0.75}As$ doped with a donor impurity supported by the substrate layer;
   f) a second doped layer of GaAs doped with a donor impurity supported by the first doped layer of $Al_{0.25}Ga_{0.75}As$ to facilitate the making of ohmic contact;
   g) a gate of Ti/Pd/Au deposited on the first doped layer by etching through the second doped GaAs layer;
   h) a source and drain electrode of alloyed AuGe/Ni/Au deposited on and sintered to the second doped layer of GaAs.

2. The hardened HEMT claimed in claim 1 wherein the acceptor impurity is Be and the concentration of Be in the doped buffer layer is about $1 \times 10^{16}$ cm$^{-3}$.

3. The hardened HEMT as claimed in claim 1 wherein the donor impurity of the first doped layer is Si and the concentration of Si in the first doped layer is about $1 \times 10^{18}$ cm$^{-3}$.

4. The hardened HEMT claimed in claim 1 wherein the donor impurity of the second doped layer is Si and the concentration of Si in the second doped layer is about $2 \times 10^{18}$ cm$^{-3}$.

* * * * *